(12) United States Patent
Sicard

(10) Patent No.: US 10,003,330 B2
(45) Date of Patent: Jun. 19, 2018

(54) IGBT DRIVER MODULE AND METHOD THEREFOR

(71) Applicant: Thierry Sicard, Auzeville Tolosane (FR)

(72) Inventor: Thierry Sicard, Auzeville Tolosane (FR)

(73) Assignee: NXP USA, Inc., Austin, TX (US)

(*) Notice: Subject to any disclaimer, the term of this patent is extended or adjusted under 35 U.S.C. 154(b) by 247 days.

(21) Appl. No.: 15/028,623

(22) PCT Filed: Oct. 18, 2013

(86) PCT No.: PCT/IB2013/002716
§ 371 (c)(1),
(2) Date: Apr. 11, 2016

(87) PCT Pub. No.: WO2015/056042
PCT Pub. Date: Apr. 23, 2015

(65) Prior Publication Data
US 2016/0248420 A1 Aug. 25, 2016

(51) Int. Cl.
| H03B 1/00 | (2006.01) |
| H03K 3/00 | (2006.01) |
| H03K 17/567 | (2006.01) |
| H03K 17/0412 | (2006.01) |
| H03K 17/06 | (2006.01) |

(Continued)

(52) U.S. Cl.
CPC .......... H03K 17/567 (2013.01); H03K 7/08 (2013.01); H03K 17/0412 (2013.01); H03K 17/06 (2013.01); H03K 17/14 (2013.01); H03K 2017/066 (2013.01); H03K 2217/0081 (2013.01)

(58) Field of Classification Search
CPC .. H03K 17/567; H03K 17/0412; H03K 17/06; H03K 17/14
USPC ........ 327/108–112, 427, 434, 437, 309, 318, 327/321, 322, 374; 326/82, 83, 87
See application file for complete search history.

(56) References Cited

U.S. PATENT DOCUMENTS 6,094,087 A * 7/2000 He ...................... H02M 1/4225
327/376
2011/0241738 A1 10/2011 Tamaoka
(Continued)

FOREIGN PATENT DOCUMENTS

EP 1769974 A1 4/2007

OTHER PUBLICATIONS

International Search Report for Application No. PCT/IB2013/002716, dated Jul. 7, 2014, 12 pages.

*Primary Examiner* — Thomas Skibinski

(57) ABSTRACT

The present invention relates to an insulated gate bipolar transistor (IGBT) driver module for driving at least one gate of at least one IGBT device, and method therefor. The IGBT driver module comprises at least one series capacitance operably coupled between a driver component of the IGBT driver module and the at least one gate of the at least one IGBT device. The IGBT driver module further comprises at least one series capacitance charge adjustment component controllable to determine a gate voltage error (ΔGerr) at the at least one gate of the at least one IGBT device and dynamically adjust a charge of the at least one series capacitance based at least partly on the determined gate voltage error (ΔGerr).

17 Claims, 6 Drawing Sheets

(51) Int. Cl.
*H03K 17/14* (2006.01)
*H03K 7/08* (2006.01)

(56) References Cited

U.S. PATENT DOCUMENTS

2011/0285447 A1 11/2011 Nakanishi
2012/0126859 A1 5/2012 Kawamoto et al.

* cited by examiner

IGBT DRIVER MODULE AND METHOD THEREFOR

FIELD OF THE INVENTION

This invention relates to an insulated-gate bipolar transistor (IGBT) driver module for driving at least one gate of at least one IGBT device, and a method therefor.

BACKGROUND OF THE INVENTION

Insulated-gate bipolar transistors (IGBTs) are power semiconductor devices primarily used as electronic switches, and in more recent devices are noted for combining high efficiency and fast switching. An IGBT combines the simple gate-drive characteristics of a metal oxide semiconductor field effect transistor (MOSFET) with the high-current and low-saturation-voltage capability of a bipolar transistor. The IGBT comprises an isolated gate field effect transistor (FED for the control input and a bipolar power transistor for a switch in a single device. IGBTs are often used in medium- to high-power applications such as switched-mode power supplies, traction motor control and induction heating. Large IGBT modules typically consist of many devices in parallel and can have very high current handling capabilities and high blocking voltages.

When an IGBT is used in a half bridge configuration, a negative voltage is required on its gate when a low side driver device is switched on in order to avoid cross conduction between high and low side driver devices. It is known to use a series capacitor topology to enable such a negative IGBT gate voltage to be generated using only a single positive supply.

FIG. 1 illustrates a simplified circuit diagram of an IGBT driver module 105 comprising a known series capacitor topology for driving an IGBT device 100. The IGBT device 100 is driven through a series capacitance Cs 110 by a high side driver device 130 and a low side driver device 140. The series capacitance Cs 110 comprises a value of, say, 10 uF. By contrast, a gate capacitance Cg (not shown) of the IGBT device 100 comprises, say, approximately 100 nF. As such, the series capacitance Cs 110 is approximately 100 times larger than the gate capacitance Cg of the IGBT device 100. As the series capacitance Cs 110 is in series with the gate 102 of the IGBT device 100, the series capacitance Cs 110 is charged and discharged along with the gate capacitance Cg of the IGBT device 100. So for a 25V voltage variation on the gate capacitance Cg of the IGBT device 100, a 0.25V voltage variation is required across the series capacitance Cs 110 (a ratio of 100:1).

In order to achieve the required negative voltage on the gate 102 of the IGBT device 100 when the low side driver device 140 is switched on (required in order to avoid cross conduction between the high and low side driver devices 130, 140), the series capacitance 110 is pre-charged to achieve a voltage there across of approximately 10V. As such, the (pre-charged) series capacitance 110 may be considered as a 10V source voltage that shifts the gate voltage of the IGBT device 100 by approximately −10V.

In FIG. 1, the IGBT driver module 105 comprises a pre-charge component arranged to pre-charge the series capacitance Cs 110. The pre-charge component illustrated in FIG. 1 comprises a Zener diode 150 controllable (via switch 152) to force a first node 112 of the series capacitance Cs distal to the gate 102 of the IGBT device 100 to its breakdown voltage (Vz) of, say, a voltage of 10.6V. The pre-charge component illustrated in FIG. 1 further comprises a closed loop amplifier 154 controllable (via switch 156) to force a second node 114 of the series capacitance operably coupled to the gate 102 of the IGBT device 100 to a voltage $\Delta V$, where $\Delta V$ is equal to the required voltage variance across the series capacitance Cs to achieve the desired voltage variance across the gate capacitance Cg. Thus, for the case described above where, for a 25V voltage variation on the gate capacitance Cg of the IGBT device 100, a 0.25V voltage variation is required across the series capacitance Cs 110 (a ratio of 100:1), $\Delta V=0.25V$. In this manner, the pre-charge component is arranged to pre-charge the series capacitance Cs 110 such that it comprises a voltage there across of $Vz-\Delta V=10.6V-0.25V=10.35V$.

The IGBT driver module 105 further comprises a high side drive cut-off component arranged to switch off a high side driver device 130 when a required voltage increase has been achieved at the gate 102 of the IGBT device 100, i.e. in the above case a 25V voltage increase. To detect such a voltage increase, the high side drive cut-off component comprises a comparator 160 arranged to compare the voltage across the series capacitance Cs 110 to a reference voltage, which in the illustrated example is provided by the Zener diode 150, and cause the high side driver device 130 to be 'switched off' (i.e. to stop forcefully driving the gate of the IGBT device 100) when the voltage across the series capacitance Cs 110 reaches the reference voltage.

As such, the comparator 160 compares the voltage across the series capacitance Cs 110 to the 10.6V breakdown voltage of the Zener diode 160 and switches off the high side driver device 130 when the voltage across the series capacitance Cs 110 reaches 10.6V. As previously mentioned, the series capacitance Cs 110 is pre-charged to 10.35V. As a result, the comparator 160 is arranged to switch off the high side driver component 130 once a required 0.25V voltage increase has been achieved across the series capacitance Cs 110. In this manner, the high side driver component 130 may be arranged to forcefully drive the gate 102 of the IGBT device 100 to achieve the 25V voltage increase thereof in a relatively short time, with the comparator 160 switching off the high side driver component 130 once the required voltage increase has been achieved.

A problem with such a technique for driving the gate 102 of an IGBT device 100 is that it requires accurate matching between the Cs:Cg ratio (i.e. the ratio between the series capacitance size and the gate capacitance size) and the variance in voltage across the series capacitance permitted before the high side driver device 130 is switched off. However, the capacitances of the series capacitance Cs 110 and the gate capacitance for the IGBT device 100 can each vary by +/−15%, which can have a significant effect on the Cs:Cg ratio, and thus the relationship between the voltage variance across the series capacitance Cs 110 and the corresponding voltage variance across the gate capacitance of the IGBT device 100. Specifically, if the ratio is too low, for example 85:1 instead of 100:1, a voltage variance of 0.25V across the series capacitance Cs 110 will only achieve a voltage variance across the gate of the IGBT device 100 of 21.25V, and not the required 25V.

SUMMARY OF THE INVENTION

The present invention provides an insulated gate bipolar transistor (IGBT) driver module for driving at least one gate of at least one IGBT device, and a method of driving at least one IGBT device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
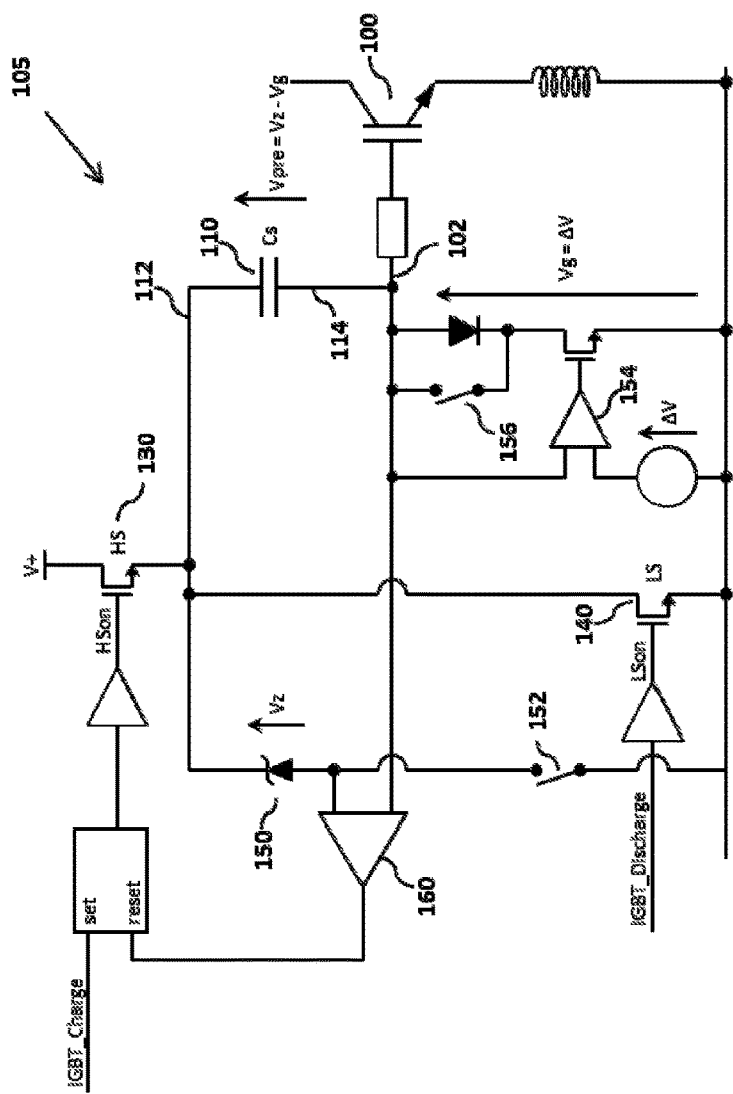
FIG. 1 illustrates a simplified circuit diagram of an IGBT driver module comprising a known series capacitor topology.

The present invention will now be described with reference to the accompanying drawings in which there is illustrated example of an insulated gate bipolar transistor (IGBT) driver module for driving a gate of at least one IGBT device. However, it will be appreciated that the present invention is not limited to the specific examples herein described with reference to the accompanying drawings, as will be apparent to a skilled person. For example, in the illustrated examples, the IGBT driver module is implemented within an integrated circuit device comprising at least one die within a single integrated circuit package, and is arranged to drive an IGBT device through a series capacitance integrated within the same integrated circuit device. However, in some examples, the IGBT driver module may be arranged to drive an IGBT device through a series capacitance provided external to the integrated circuit device within which the IGBT driver module is implemented.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of a first aspect of the present invention, there is provided an insulated gate bipolar transistor (IGBT) driver module for driving at least one gate of at least one IGBT device. The IGBT driver module comprises at least one series capacitance operably coupled between a driver component of the IGBT driver module and the at least one gate of the at least one IGBT device. The IGBT driver module further comprises at least one series capacitance charge adjustment component controllable to determine a gate voltage error (ΔGerr) at the at least one gate of the at least one IGBT device and dynamically adjust a charge of the at least one series capacitance based at least partly on the determined gate voltage error (ΔGerr).

In this manner, the series capacitance adjustment component is able to dynamically adjust the charge stored within the series capacitance in order to compensate for variances in the capacitances of the series capacitance and the gate capacitance for the IGBT device to enable a required voltage variance of the gate capacitance for the IGBT device between high and low drive phases to be achieved.

Optionally, the at least one series capacitance charge adjustment component may be arranged to compare a gate voltage of the IGBT device to a gate reference voltage to determine the gate voltage error.

Optionally, the at least one series capacitance charge adjustment component may be arranged to:
  increase an amount of charge stored in the at least one series capacitance, if the gate voltage of the IGBT device is greater than the gate reference voltage; and
  decrease the amount of charge stored in the at least one series capacitance, if the gate voltage of the IGBT device is less than the gate reference voltage.

Optionally, the at least one series capacitance charge adjustment component may be arranged to control at least one current source component operably coupled in parallel across the at least one series capacitance based on the determined gate voltage error.

Optionally, the at least one series capacitance charge adjustment component may be arranged to control the at least one current source component to apply a current to the at least one series capacitance proportional to the determined gate voltage error.

Optionally, the IGBT driver module may further comprise at least one pre-charge component controllable to pre-charge the series capacitance.

Optionally, the at least one pre-charge component may be controllable to pre-charge the at least one series capacitance to comprise a voltage there across of a series capacitance reference voltage less an anticipated required voltage variance for the at least one series capacitance.

Optionally, the IGBT driver module may further comprise at least one high side drive cut-off component arranged to switch off at least one high side driver device of the driver component of the IGBT driver module when a required voltage increase has been achieved at the at least one gate of the at least one IGBT device.

Optionally, the at least one high side drive cut-off component may comprise at least one comparator arranged to compare a voltage across the at least one series capacitance Cs to a series capacitance reference voltage, and cause the at least one high side driver device to be switched off when the voltage across the at least one series capacitance Cs is at least equal to the series capacitance reference voltage.

Optionally, the at least one high side driver device may be arranged to supply a reduced current to the at least one series capacitance upon being switched off by the at least one high side drive cut-off component.

Optionally, the IGBT driver module may further comprise at least one control component configurable to control the at least one series capacitance charge adjustment component to determine a gate voltage error at the at least one gate of the at least one IGBT device and dynamically adjust a charge of the at least one series capacitance based on the determined gate voltage error.

Optionally, the at least one control component may further be configurable to control the at least one series capacitance charge adjustment component to determine a gate voltage error at the at least one gate of the at least one IGBT device and dynamically adjust a charge of the at least one series capacitance based on the determined gate voltage error during a high gate drive phase of a pulse width modulation drive mode of the IGBT driver module.

Optionally, the at least one control component ma further be configurable to control the at least one pre-charge component to pre-charge the series capacitance upon initialisation of the IGBT driver module.

Optionally, the IGBT driver module may be implemented within an integrated circuit device comprising at least one die within a single integrated circuit package.

According to some examples of a second aspect of the present invention, there is provided a method of driving at least one insulated gate bipolar transistor (IGBT) device. The method comprises determining a gate voltage error at a gate of the IGBT device, and dynamically adjusting a charge of a series capacitance operably coupled between a driver component and the gate of the at least one IGBT device based at least partly on the determined gate voltage error.

Optionally, the method may comprise comparing a gate voltage of the IGBT device to a gate reference voltage to determine the gate voltage error.

Optionally, the method may comprise:
increasing an amount of charge stored in the at least one series capacitance, if the gate voltage of the IGBT device is greater than the gate reference voltage; and
decreasing the amount of charge stored in the at least one series capacitance, if the gate voltage of the IGBT device is less than the gate reference voltage.

Optionally, the method may comprise controlling a current source to apply a current to the at least one series capacitance proportional to the determined gate voltage error.

Optionally, the method may comprise determining a gate voltage error at the at least one gate of the at least one IGBT device and dynamically adjusting a charge of the at least one series capacitance based on the determined gate voltage error during a high gate drive phase of a pulse width modulation drive mode.

Figure 2:
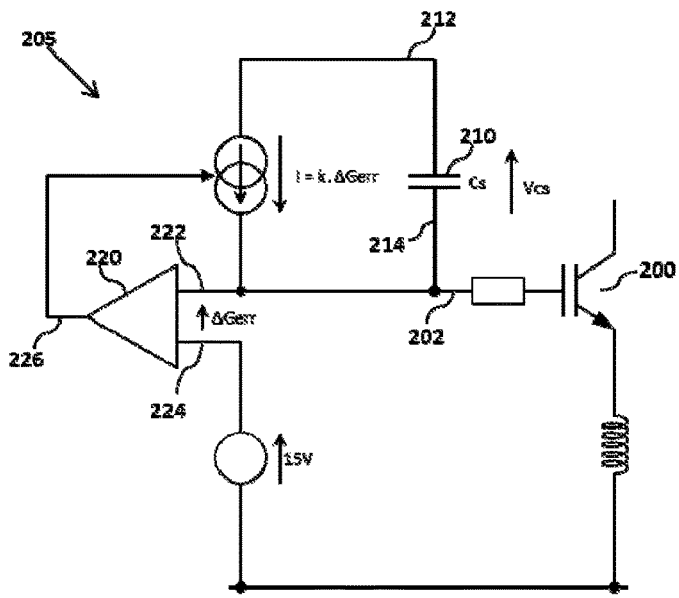
FIG. 2 illustrates a simplified circuit diagram of an example of a part of an IGBT driver module comprising a series capacitance charge adjustment component.

Referring first to FIG. 2, there is illustrated a simplified circuit diagram of an example of a part of an IGBT driver module comprising a series capacitance charge adjustment component 205. The series capacitance charge adjustment component 205 is arranged to determine a gate voltage error ΔGerr at a gate 202 of an IGBT device 200, and to dynamically adjust a charge of a series capacitance 210 operably coupled between a driver component (not shown) of the IGBT driver module and the gate 202 of the IGBT device 200 based at least partly on the determined gate voltage error ΔGerr. In the illustrated example, the series capacitance adjustment component 205 comprises a comparator 220 arranged to compare a gate voltage 222 of the IGBT device 200 to a gate reference voltage 224 to determine the gate voltage error (ΔGerr), and to output a gate voltage error signal 226 based on the comparison of the gate voltage 222 and the gate reference voltage 224. In some examples, the gate reference voltage 224 may comprise a required high gate drive voltage. For example, where a 25V gate voltage variation is required for driving the IGBT device 200 ranging from, say, −10V to +15V, the high gate drive voltage may be equal to +15V. Thus, in the illustrated example, the gate reference voltage 224 comprises a +15V signal.

The series capacitance charge adjustment component 205 illustrated in FIG. 2 is arranged to increase an amount of charge stored in the series capacitance 210 if the gate voltage of the IGBT device 200 is greater than the gate reference voltage, and decrease the amount of charge stored in the series capacitance 210 if the gate voltage of the IGBT device 200 is less than the gate reference voltage. Specifically, in the illustrated example the gate voltage error signal 226 output by the comparator 220 is used as a control signal for a current source component 230 operably coupled in parallel across the series capacitance 210. In this manner, the series capacitance charge adjustment component 220 is arranged to control the current source component 230 to apply a current to the series capacitance 210 proportional to the determined gate voltage error.

As described in greater detail below with reference to FIG. 6, during a high gate drive phase of a pulse width modulation drive mode of an IGBT driver module of which the series capacitance charge adjustment component 205 forms a part, a high side drive cut-off component may be arranged to switch off a high side driver device when a required voltage increase has been achieved at the gate 202 of the IGBT device 200. To detect such a voltage increase, the high side drive cut-off component may compare the voltage across the series capacitance Cs 210 to a series capacitance reference voltage, and cause the high side driver device to be 'switched off' (i.e. to stop forcefully driving the gate of the IGBT device 200) when the voltage across the series capacitance Cs 210 reaches the series capacitance reference voltage. In order to ensure the required voltage variance across the gate capacitance of the IGBT device 200 is achieved, variances in the capacitances of the series capacitance Cs 210 and the gate capacitance (not shown) for the IGBT device 200 must be compensated for. Advantageously, by increasing an amount of charge stored in the series capacitance 210 if the gate voltage of the IGBT device 200 is greater than the gate reference voltage, and decreasing the amount of charge stored in the series capacitance 210 if the gate voltage of the IGBT device 200 is less than the gate reference voltage, such variances in the capacitances of the series capacitance Cs 210 and the gate capacitance (not shown) for the IGBT device 200 must be compensated for, enabling the required voltage variance across the gate capacitance of the IGBT device 200 to be achieved.

Figure 3:
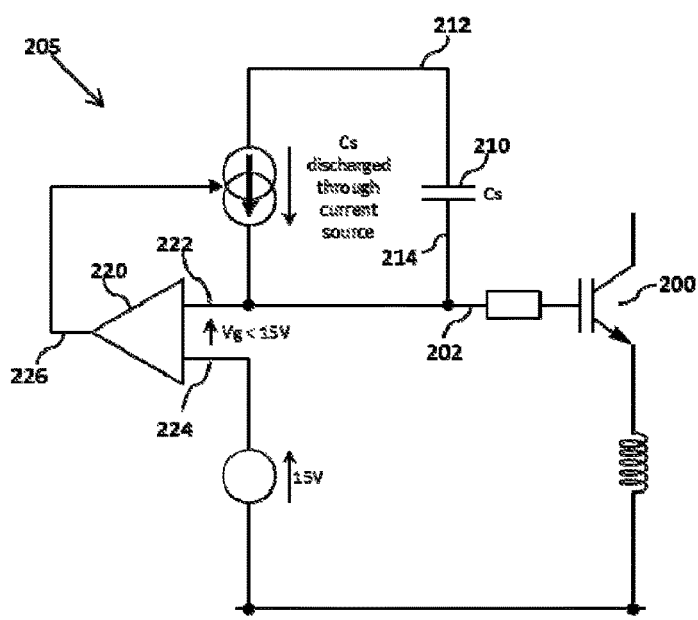
FIG. 3 illustrates a simplified circuit diagram of an example of the series capacitance charge adjustment component of FIG. 2 where the gate voltage of the IGBT device is less than a gate reference voltage.

FIG. 3 illustrates a simplified circuit diagram of an example of the series capacitance charge adjustment component 205 where the gate voltage 222 of the IGBT device 200 is less than the gate reference voltage 224. In the example illustrated in FIG. 3, because the gate voltage 222 of the IGBT device 200 is less than the gate reference voltage 224, the comparator 226 outputs a corresponding gate voltage error signal 226, which causes the current source component 230 to apply a discharging current between a first node 212 of the series capacitance Cs 210 distal to the gate 202 of the IGBT device 200 and a second node 214 of the series capacitance Cs 210 operably coupled to the gate 202 of the IGBT device 200. In this manner, by applying such a discharging current to the series capacitance Cs 210, the amount of charge stored within the series capacitance Cs 210 is reduced.

Significantly, and as described in greater detail below with reference to FIG. 6, by dynamically reducing the amount of charge stored within the series capacitance 210 when the gate voltage 222 of the IGBT device 200 is less than the gate reference voltage 224, the amount of charge required to be driven into the series capacitance 210 before the voltage across the series capacitance Cs 210 reaches the series capacitance reference voltage is increased. A corresponding increase in the amount of charge driven into the gate capacitance of the IGBT device 200 is also achieved, thereby increasing the gate voltage of the IGBT device 200 when the voltage across the series capacitance Cs 210 reaches the series capacitance reference voltage, and thus when the high side drive cut-off component switches off the high side driver device.

Figure 4:
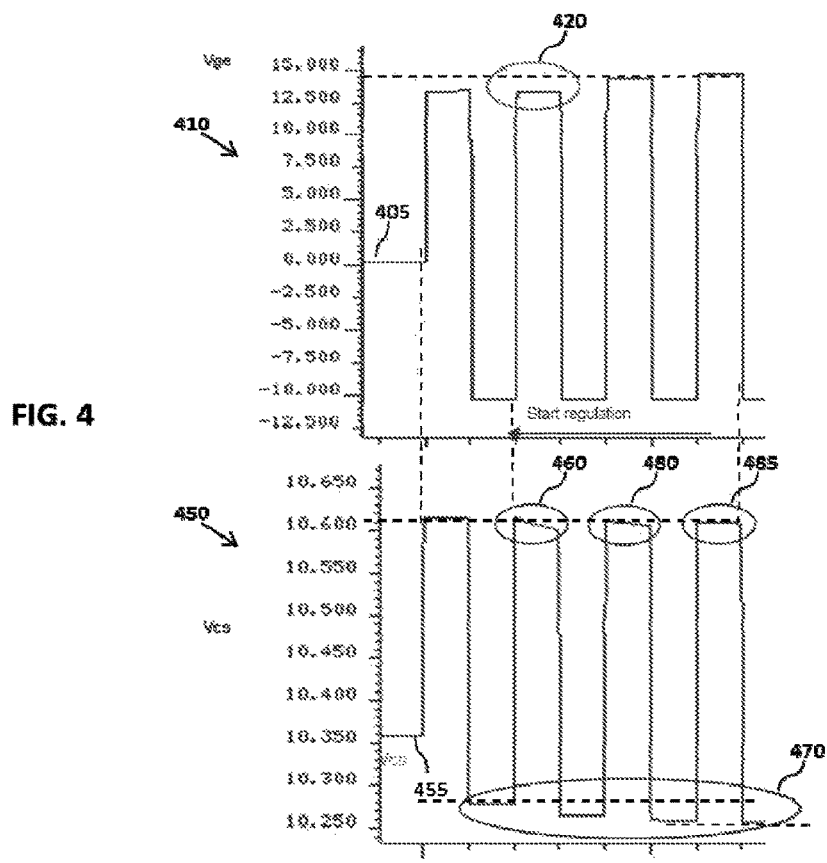
FIG. 4 illustrates simplified graphs showing an example of the effect of dynamic adjustment of the charge stored within the series capacitance where the gate voltage of the IGBT device is less than a gate reference voltage.

FIG. 4 illustrates simplified graphs showing an example of the effect of the dynamic adjustment of the charge stored within the series capacitance 210 where the gate voltage (Vge) 222 of the IGBT device 200 is less than the gate reference voltage 224. In example illustrated in FIG. 4, a first graph 410 illustrates the gate voltage (Vge) 222 of the IGBT device 200 over time, and shows the start of a pulse width modulation driving mode where the gate voltage (Vge) 222 starts in a non-driven state of 0V at 405 and is then driven by alternating high and low drive signals. In the example illustrated, during the initial high gate drive phases the gate voltage (Vge) 222 is driven to a voltage that is less than a required high gate drive voltage of +15V, for example due to a mismatch between the series capacitance 210 and the gate capacitance (not shown). During the second (and each subsequent) high gate drive phase 420, the comparator 220 of the series capacitance adjustment component 205 compares the gate voltage 222 of the IGBT device 200 to the gate reference voltage 224 to determine the gate voltage error (ΔGerr), and outputs a gate voltage error signal 226 based on the comparison of the gate voltage 222 and the gate reference voltage 224.

A second graph 450 of FIG. 4 illustrates the voltage (Vcs) across the series capacitance 210. As can be seen in FIG. 4, the series capacitance is pre-charged to 10.35 volts, as indicated at 455. During each high gate drive phase, the series capacitance Cs 210 is driven up to a voltage of 10.6V, at which point a high side drive cut-off component switches off a high side driver device. During the second high gate drive phase, because the gate voltage 222 of the IGBT device 200 is below the gate reference voltage 224, the gate voltage error signal 226 output by the comparator 220 causes the current source component 230 to apply a discharging current between the first node 212 of the series capacitance Cs 210 and the second node 214 of the series capacitance Cs 210. As a result, the amount of charge stored within the series capacitance Cs 210 is reduced, causing the voltage the voltage (Vcs) across the series capacitance 210 to reduce, as illustrated at 460.

During each low gate drive phase, the gate 202 of the IGBT is pulled down to a low voltage level of, in the illustrated examples, −10V via the series capacitance Cs 210. In the example illustrated in FIG. 4, when the charge stored within the series capacitance Cs 210 has been reduced during the high gate drive phase as illustrated at 460, the voltage across the series capacitance Cs 210 will be lower during the subsequent low gate drive phase, as illustrated at 470. Consequently, during the next high gate drive phase when the series capacitance Cs 210 is driven up to the voltage of 10.6V, at which point a high side drive cut-off component switches off a high side driver device, the voltage variance across the series capacitance Cs 210 during the transition from the low gate drive phase to the high gate drive phase has increased since the previous transition due to the lower starting voltage from the low gate drive phase.

During each subsequent high gate drive phase, the gate voltage error signal 226 output by the comparator 220 will continue to cause the current source component 230 to apply a discharging current between the first node 212 of the series capacitance Cs 210 and the second node 214 of the series capacitance Cs 210 until the gate voltage 222 of the IGBT device 200 is substantially equal to the gate reference voltage 224. In this manner, the series capacitance adjustment component is able to dynamically adjust the charge stored within the series capacitance Cs 210 in order to compensate for variances in the capacitances of the series capacitance Cs 210 and the gate capacitance (not shown) for the IGBT device 200, to enable a required voltage variance of the gate capacitance for the IGBT device 200 between high and low drive phases to be achieved.

In some examples, the series capacitance charge adjustment component 220 is arranged to control the current source component 230 to apply a current to the series capacitance 210 proportional to the determined gate voltage error, as illustrated in FIG. 4. In this manner, the amount by which the series capacitance adjustment component dynamically adjusts the charge stored within the series capacitance Cs 210 during each cycle may correspond to the amount by which the gate voltage 222 of the IGBT device 200 differs from the gate reference voltage 224, as illustrated generally at 480, 485.

Figure 5:
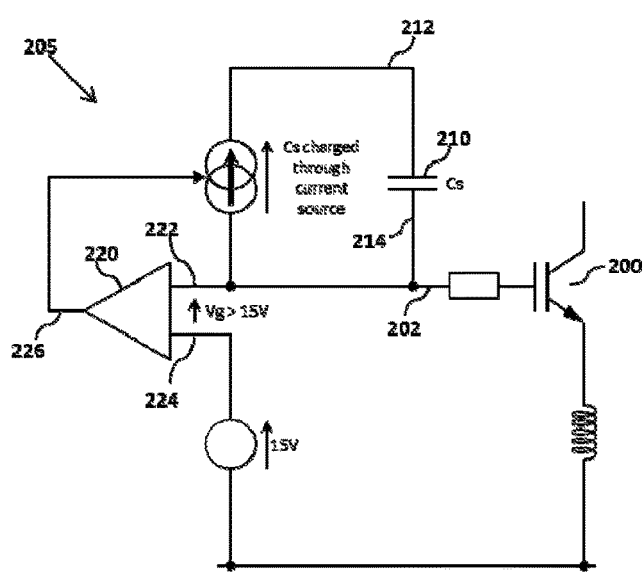
FIG. 5 illustrates a simplified circuit diagram of an example of the series capacitance charge adjustment component of FIG. 2 where the gate voltage of the IGBT device is greater than a gate reference voltage.

FIG. 5 illustrates a simplified circuit diagram of an example of the series capacitance charge adjustment component 205 where the gate voltage 222 of the IGBT device 200 is greater than the gate reference voltage 224. In the example illustrated in FIG. 5, because the gate voltage 222 of the IGBT device 200 is greater than the gate reference voltage 224, the comparator 226 outputs a corresponding gate voltage error signal 226, which causes the current source component 230 to apply a charging current between the first node 212 of the series capacitance Cs 210 and the second node 214 of the series capacitance Cs 210. In this manner, by applying such a charging current to the series capacitance Cs 210, the amount of charge stored within the series capacitance Cs 210 is increased.

Significantly, and as described in greater detail below with reference to FIG. 6, by dynamically increasing the amount of charge stored within the series capacitance 210 when the gate voltage 222 of the IGBT device 200 is greater than the gate reference voltage 224, the amount of charge required to be driven into the series capacitance 210 before the voltage across the series capacitance Cs 210 reaches the series capacitance reference voltage is reduced. A corresponding reduction in the amount of charge driven into the gate capacitance of the IGBT device 200 is also achieved, thereby reducing the gate voltage of the IGBT device 200 when the voltage across the series capacitance Cs 210 reaches the series capacitance reference voltage, and thus when the high side drive cut-off component switches off the high side driver device.

In this manner, the series capacitance adjustment component 200 is able to dynamically reduce as well as increase the charge stored within the series capacitance Cs 210 in order to compensate for variances in the capacitances of the series capacitance Cs 210 and the gate capacitance (not shown) for the IGBT device 200, to enable a required voltage variance of the gate capacitance for the IGBT device 200 between high and low drive phases to be achieved.

Figure 6:
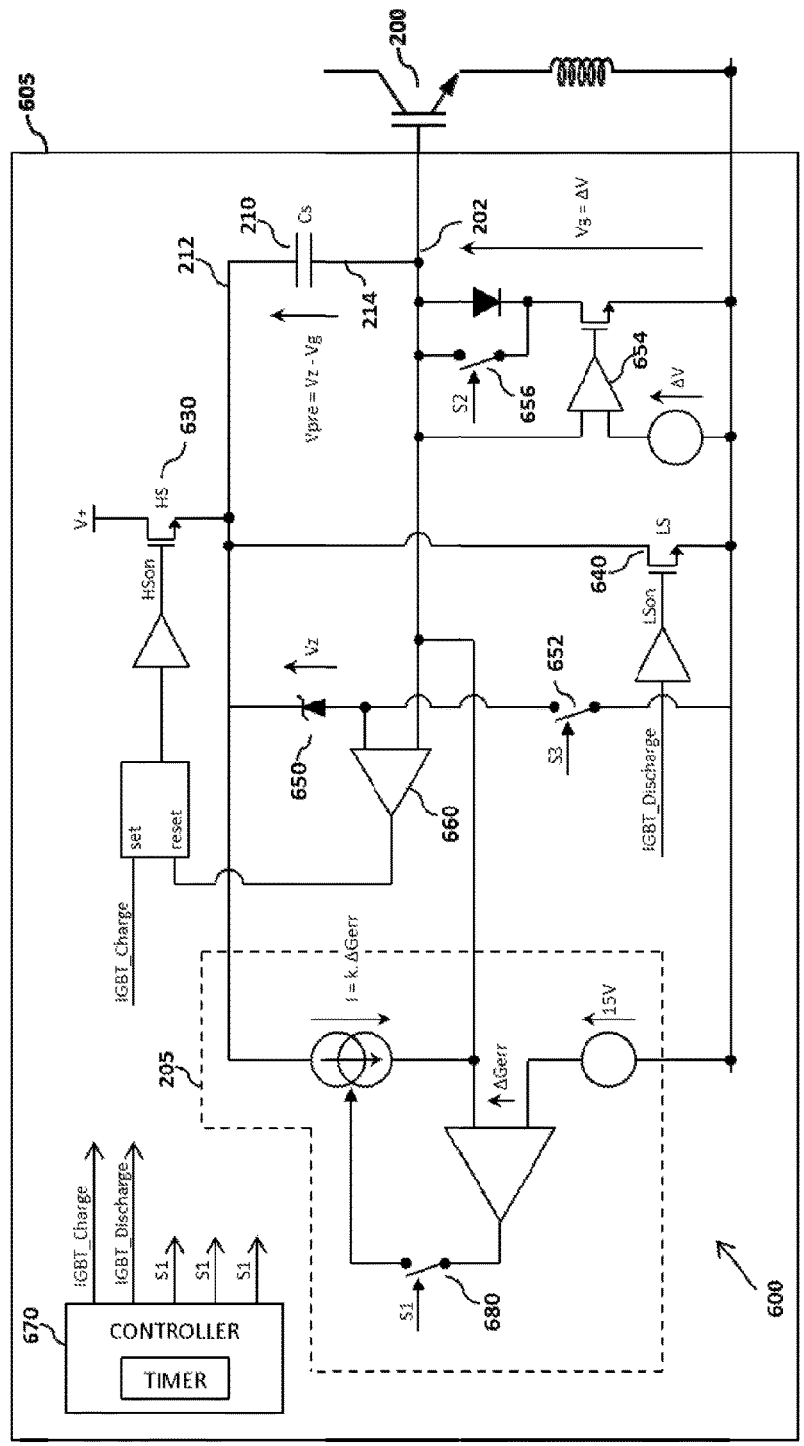
FIG. 6 illustrates a simplified circuit diagram of an example of an IGBT driver module comprising an example of a series capacitance adjustment component.

Referring now to FIG. 6, there is illustrated a simplified circuit diagram of an example of an IGBT driver module 600 comprising an example of a series capacitance adjustment component, such as the series capacitance adjustment component 200 illustrated in FIGS. 2, 3 and 5. The IGBT driver module 600 in the illustrated example is implemented within an integrated circuit device 605 comprising at least one die within a single integrated circuit package, and comprises a series capacitor topology for driving an IGBT device 200. The IGBT device 200 is driven through a series capacitance Cs 210 by a high side driver device 630 and a low side driver device 640. The series capacitance Cs 210 comprises an expected value of, say, 60 uF. By contrast, a gate capacitance Cg (not shown) of the IGBT device 200 comprises, say, an expected capacitance of 200 nF. As such, the series capacitance Cs 210 is (theoretically) 100 times larger than the gate capacitance Cg of the IGBT device 200. As the series capacitance Cs 210 is in series with the gate 202 of the IGBT device 200, the series capacitance Cs 210 is charged and discharged along with the gate capacitance Cg of the IGBT device 200. So for a 25V voltage variation on the gate capacitance Cg of the IGBT device 200, a 0.25V voltage variation is expected to be required across the series capacitance Cs 210 (a ratio of 100:1).

In order to achieve the (expected) required negative voltage on the gate 602 of the IGBT device 200 when the low side driver device 640 is switched on (required in order to avoid cross conduction between the high and low side driver devices 630, 640), the series capacitance 210 is pre-charged to achieve a voltage there across of approximately 10V. As such, the (pre-charged) series capacitance 210 may be considered as a 10V source voltage that shifts the gate voltage of the IGBT device 200 by approximately −10V.

The IGBT driver module 600 comprises a pre-charge component arranged to pre-charge the series capacitance Cs 210. The pre-charge component illustrated in FIG. 6 comprises a Zener diode 650 controllable (via switch 652) to force the first node 212 of the series capacitance Cs 210 distal to the gate 202 of the IGBT device 200 to its breakdown voltage (Vz) of, say, a voltage of 10.6V. The pre-charge component illustrated in FIG. 6 further comprises a closed loop amplifier 654 controllable (via switch 656) to force the second node 214 of the series capacitance operably coupled to the gate 202 of the IGBT device 200 to a voltage ΔV, where ΔV may be equal to, say, the (expected) required voltage variance across the series capacitance Cs to achieve the desired voltage variance across the gate capacitance Cg. Thus, for the case described above where, for a 25V voltage variation on the gate capacitance Cg of the IGBT device 200, a 0.25V voltage variation is required across the series capacitance Cs 210 (a ratio of 100:1), ΔV=0.25V. In this manner, the pre-charge component is arranged to pre-charge the series capacitance Cs 210 such that it comprises a voltage there across of Vz−ΔV=10.6V−0.25V=10.35V.

The IGBT driver module 600 further comprises a high side drive cut-off component arranged to switch off the high side driver device 630 when a required voltage increase has been achieved at the gate 202 of the IGBT device 200, i.e. in the above case a 25V voltage increase. To detect such a voltage increase, the high side drive cut-off component comprises a comparator 660 arranged to compare the voltage across the series capacitance Cs 210 to a series capacitance reference voltage and cause the high side driver device 630 to be 'switched off' (i.e. to stop forcefully driving the gate of the IGBT device 200) when the voltage across the series capacitance Cs 210 reaches the series capacitance reference voltage. In the illustrated example, the series capacitance reference voltage comprises the breakdown voltage (Vz) provided by the Zener diode 650. In this manner, the voltage to which the pre-charge component is arranged to force the first node 212 of the series capacitance Cs 210 is equal to the serial capacitance reference voltage.

As such, in the illustrated example the comparator Δ compares the voltage across the series capacitance Cs 210 to the 10.6V voltage across the Zener diode 660 and switches off the high side driver device 630 when the voltage across the series capacitance Cs 210 reaches 10.6V. As previously mentioned, the series capacitance Cs 210 is pre-charged to 10.35V. As a result, assuming ideal capacitance values for the series capacitance Cs 210 and the gate capacitance of the IGBT device 200, the comparator 660 is arranged to switch off the high side driver component 630 once an expected required 0.25V voltage increase has been achieved across the series capacitance Cs 210. In this manner, the high side driver component 630 may be arranged to forcefully drive the gate 602 of the IGBT device 200 to achieve the 25V voltage increase thereof in a relatively short time, with the comparator 660 switching off the high side driver component 630 once the required voltage increase has been achieved.

However, the capacitances of the series capacitance Cs 210 and the gate capacitance for the IGBT device 200 can each vary by +/−15%, which can have a significant effect on the Cs:Cg ratio, and thus the relationship between the voltage variance across the series capacitance Cs 210 and the corresponding voltage variance across the gate capacitance of the IGBT device 200. Specifically, if the ratio is too low, for example 85:1 instead of 100:1, a voltage variance of 0.25V across the series capacitance Cs 210 will only achieve a voltage variance across the gate of the IGBT device 200 of 21.25V, and not the required 25V. Consequently, such a low voltage variance across the gate of the IGBT device 200 will result in the gate of the IGBT not being driven as forcefully as required/desired.

To compensate for variances in the capacitances of the series capacitance Cs 210 and the gate capacitance for the IGBT device 200, the IGBT driver module 600 comprises the series capacitance charge adjustment component 205, such as hereinbefore described, arranged to determine a gate voltage error ΔGerr at the gate 202 of an IGBT device 200, and to dynamically adjust a charge of the series capacitance 210 based at least partly on the determined gate voltage error ΔGerr. In this manner, the series capacitance adjustment component 205 is able to dynamically adjust the amount of charge stored within the series capacitance Cs 210 in order to compensate for variances in the capacitances of the series capacitance Cs 210 and the gate capacitance (not shown) for the IGBT device 200, to enable a required voltage variance of the gate capacitance for the IGBT device 200 between high and low drive phases to be achieved.

In some examples, the IGBT driver module 600 may comprise a control component 670 configurable to control the series capacitance charge adjustment component 205 to determine a gate voltage error at the gate 202 of the IGBT device 200 and dynamically adjust a charge of the series capacitance Cs 210 based on the determined gate voltage error. For example, and as illustrated in FIG. 6, the series capacitance charge adjustment component 205 may comprise a switch 680 controllable to operably couple the output of the comparator 220 to the current source component 230. The control component 670 may be configurable to control the switch 680, and in this manner may be arranged to control when the output of the comparator 220 is operably coupled to the current source component 230 by the switch

680, and thus when the gate voltage error signal 226 output by the comparator 220 is used as a control signal for the current source component 230 to adjust the amount of charge stored within the series capacitance Cs 210 in order to compensate for variances in the capacitances of the series capacitance Cs 210 and the gate capacitance (not shown) for the IGBT device 200. For example, in some embodiments the control component 670 may be arranged to control the series capacitance charge adjustment component 205 adjust a charge of the at least one series capacitance Cs 210 during a high gate drive phase of a pulse width modulation drive mode of the IGBT driver module 600. In some examples, the control component 670 may be arranged to control the series capacitance charge adjustment component 205 adjust a charge of the at least one series capacitance Cs 210 during a second and each subsequent high gate drive phase of a pulse width modulation drive mode of the IGBT driver module 600.

In the illustrated example, the control component 670 is further configurable to control the pre-charge component to pre-charge the series capacitance Cs 210 upon initialisation of the IGBT driver module 600, via switches 652, 656.

From the above description, it will be apparent that the example series capacitance charge adjustment component 210 hereinbefore described is capable of adjusting the charge stored within the series capacitance Cs 210 during one or more high gate drive phase(s) of a pulse width modulation drive mode of the IGBT driver module 600 in order to compensate for variances in the capacitances of the series capacitance Cs 210 and the gate capacitance for the IGBT device 200, and to enable a required/desired voltage variance across the gate of the IGBT device 200 to be achieved, and in particular to ensure that a required/desired high gate drive voltage to be achieved.

In some further examples, the high side driver device 630 of the IGBT driver module 600 may be arranged to supply a reduced current to the series capacitance Cs 210 upon being switched off by the high side drive cut-off component. For example, the high side driver device 630 may be arranged to supply a reduced current of, say, 60 µA. In this manner, during a DC (direct current) drive mode of the IGBT driver module 600, the supply of such a reduced current to the series capacitance Cs 210 enables the charge stored within the series capacitance Cs 210 to be slowly increased during the DC drive mode of the IGBT driver module 600, thereby slowly increasing the gate voltage of the IGBT device 200. In this manner, during such a DC drive mode of the IGBT driver module 600, a gate voltage of the IGBT device 200 may initially be targeted at a voltage lower than the required/desired high gate drive voltage (e.g. +12V instead of +15V), and slowly charged up to, say, 15V with the reduced current, at which point the gate voltage may be clamped at the desired voltage.

Figure 7:
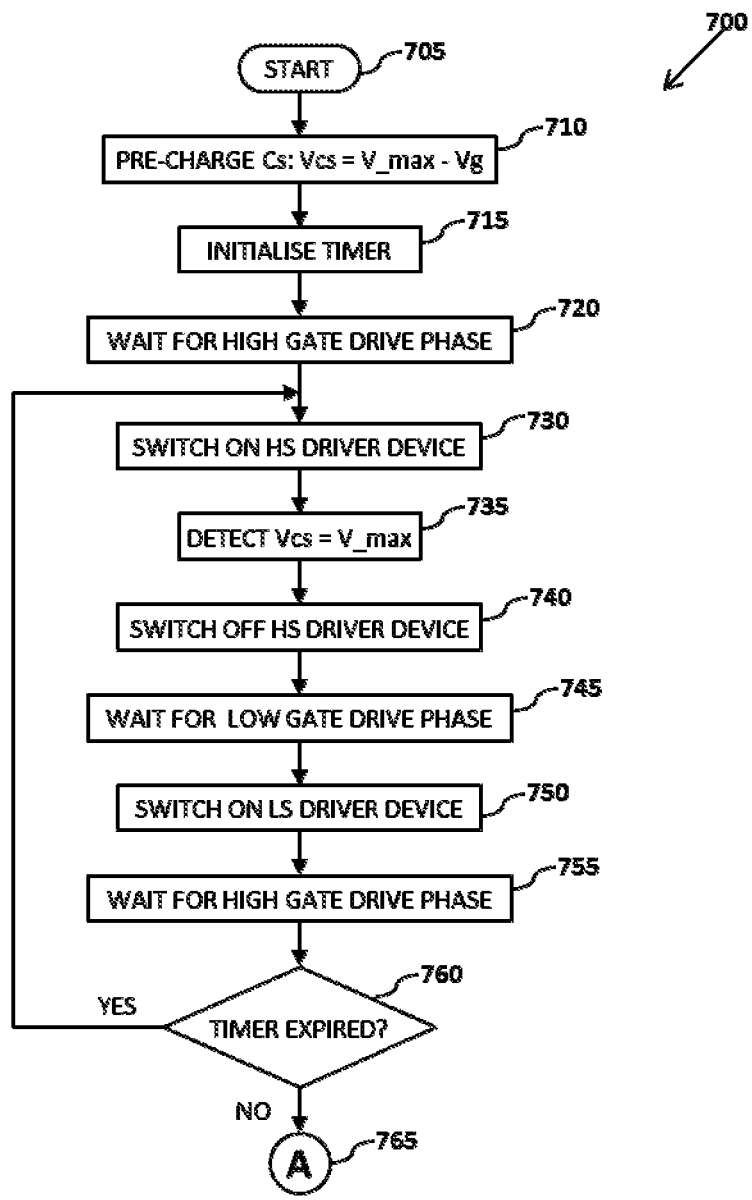
FIGS. 7 and 8 illustrate simplified flowcharts of an example of a method of driving at least one IGBT device
Figure 8:
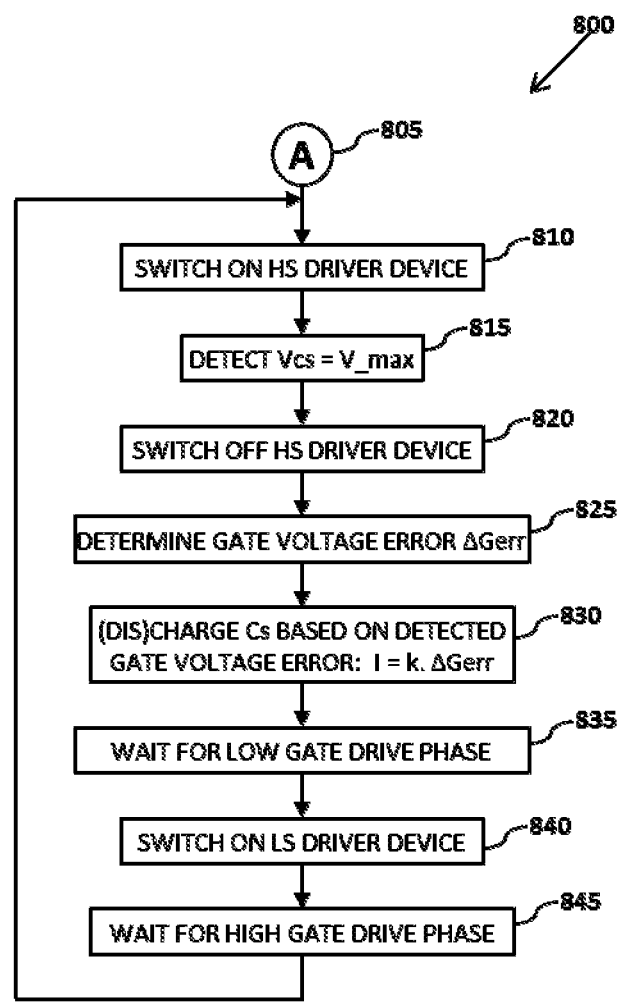

Referring now to FIGS. 7 and 8 there are illustrated simplified flowcharts 700, 800 of an example of a method of driving at least one IGBT device, such as may be implemented within the IGBT driver module 600 illustrated in FIG. 6. Referring first to the flowchart 700 of FIG. 7, the method starts at 705, for example with the initialisation of the IGBT module 600, and moves on to 710 where a series capacitance is pre-charged to a voltage there across of a series capacitance reference voltage (V_max) less a voltage ΔV, where ΔV is equal to the required voltage variance across the series capacitance Cs to achieve the desired voltage variance across the gate capacitance Cg. In the illustrated example a timer is then initialised at 715 in order to determine whether the IGBT device is being driven in a PWM mode (in which alternating high a low gate drive phases will occur) or a DC mode (in which a prolonged, continuous high gate drive phase will occur). For example, a PWM frequency may be around, say, 10 kHz with a period close to 100 us. The timer initiated at 715 may be arranged to measure, say, 200 us. If no output commutation happens during this 200 us, we start the DC mode. If the output commutes before the end of the 200 us, it may be determined that the IGBT device is being driven in a PWM mode.

In the illustrated example, upon the start of a subsequent high gate drive phase, the method comprises switching on a high side driver device at 730 to forcefully drive the IGBT device gate to a high voltage, via the series capacitance. Upon the voltage (Vcs) across the series capacitance equalling the series capacitance reference voltage (V_max), at 735, the high side driver device is switched off, at 740. The method then waits for the start of a low gate drive phase, at 745. During the subsequent low gate drive phase, the method comprises switching on a low side driver device at 750. The method then waits for the start of a high gate drive phase, at 755.

In the illustrated example, upon the start of a subsequent high gate drive phase, the method comprises determining whether the timer has expired upon the start of a subsequent high gate drive phase at 760. If the timer has expired, the method loops back to 725. However, if the timer has not expired, it may be determined that the IGBT device is being driven in a PWM mode (in which alternating high a low gate drive phases will occur) and not a DC mode (in which a prolonged, continuous high gate drive phase will occur), and the method moves on to the flowchart of FIG. 8, as illustrated at 765.

Referring now to the flowchart 800 of FIG. 8, this part of the method starts at 805 and moves on to 810 where the, during the high gate drive phase, the method comprises switching on a high side driver device to forcefully drive the IGBT device gate to a high voltage, via the series capacitance. Upon the voltage (Vcs) across the series capacitance equalling the series capacitance reference voltage (V_max), at 815, the high side driver device is switched off, at 820. A gate voltage error (ΔGerr) is then determined at 825, for example by way of comparing a gate voltage of the IGBT device to a gate reference voltage. A charge of the series capacitance is then dynamically adjusted at 830 based at least partly on the determined gate voltage error. For example, the method may comprise increasing an amount of charge stored in the at least one series capacitance if the gate voltage of the IGBT device is greater than the gate reference voltage, and decreasing the amount of charge stored in the at least one series capacitance, if the gate voltage of the IGBT device is less than the gate reference voltage. In some examples, the charge of the series capacitance may be adjusted by way of controlling a current source to apply a current to the series capacitance proportional to the determined gate voltage error. The method then waits for the start of a low gate drive phase, at 835.

During the subsequent low gate drive phase, the method comprises switching on a low side driver device at 840. The method then waits for the start of a high gate drive phase, at 845. The method then loops back to 810 at the start of the next high gate drive phase.

At least some parts of the invention, such as some parts implemented within the control component 670 illustrated in FIG. 6, may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, in the example illustrated in FIG. 1, the control component 670 has been illustrated and described as being implemented within the same integrated circuit device 605 as the other components of the IGBT driver module 600, such as the series capacitance charge adjustment component 205. However, the controller component 670 may equally be implemented, completely or in part, within a separate integrated circuit device.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An insulated gate bipolar transistor, IGBT, driver module for driving at least one gate of at least one IGBT device; the IGBT driver module comprising:
   at least one series capacitance operably coupled between a driver component of the IGBT driver module and the at least one gate of the at least one IGBT device; and
   at least one series capacitance charge adjustment component controllable to determine a gate voltage error at the at least one gate of the at least one IGBT device and dynamically adjust a charge of the at least one series capacitance based at least partly on the determined gate voltage error, wherein the IGBT driver module further comprises at least one control component configurable to control the at least one series capacitance charge adjustment component to determine a gate voltage error at the at least one gate of the at least one IGBT device and dynamically adjust a charge of the at least one series capacitance based on the determined gate voltage error.

2. The IGBT driver module of claim 1, wherein the at least one series capacitance charge adjustment component is arranged to compare a gate voltage of the IGBT device to a gate reference voltage to determine the gate voltage error.

3. The IGBT driver module of claim 2, wherein the at least one series capacitance charge adjustment component is arranged to:
   increase an amount of charge stored in the at least one series capacitance, if the gate voltage of the IGBT device is greater than the gate reference voltage; and
   decrease the amount of charge stored in the at least one series capacitance, if the gate voltage of the IGBT device is less than the gate reference voltage.

4. The IGBT driver module of claim 1, wherein the at least one series capacitance charge adjustment component is arranged to control at least one current source component operably coupled in parallel across the at least one series capacitance based on the determined gate voltage error.

5. The IGBT driver module of claim 4, wherein the at least one series capacitance charge adjustment component is arranged to control the at least one current source component to apply a current to the at least one series capacitance proportional to the determined gate voltage error.

6. The IGBT driver module of claim 1, wherein the IGBT driver module further comprises at least one pre-charge component controllable to pre-charge the series capacitance.

7. The IGBT driver module of claim 6, wherein the at least one pre-charge component is controllable to pre-charge the at least one series capacitance to comprise a voltage there across of a series capacitance reference voltage less an anticipated required voltage variance for the at least one series capacitance.

8. The IGBT driver module of claim 1, wherein the IGBT driver module further comprises at least one high side drive cut-off component arranged to switch off at least one high side driver device of the driver component of the IGBT driver module when a required voltage increase has been achieved at the at least one gate of the at least one IGBT device.

9. The IGBT driver module of claim 8, wherein the at least one high side drive cut-off component comprises at least one comparator arranged to compare a voltage across the at least one series capacitance $C_s$ to a series capacitance reference voltage, and cause the at least one high side driver device to be switched off when the voltage across the at least one series capacitance $C_s$ is at least equal to the series capacitance reference voltage.

10. The IGBT driver module of claim 8, wherein the at least one high side driver device is arranged to supply a reduced current to the at least one series capacitance upon being switched off by the at least one high side drive cut-off component.

11. The IGBT driver module of claim 1, wherein the at least one control component is further configurable to control the at least one series capacitance charge adjustment component to determine a gate voltage error at the at least one gate of the at least one IGBT device and dynamically adjust a charge of the at least one series capacitance based on the determined gate voltage error during a high gate drive phase of a pulse width modulation drive mode of the IGBT driver module.

12. The IGBT driver module of claim 1, wherein the at least one control component is further configurable to control the at least one pre-charge component to pre-charge the series capacitance upon initialisation of the IGBT driver module.

13. The IGBT driver module of claim 1 implemented within an integrated circuit device comprising at least one die within a single integrated circuit package.

14. A method of driving at least one insulated gate bipolar transistor, IGBT, device, the method comprising:
   determining a gate voltage error at a gate of the IGBT device;
   dynamically adjusting a charge of a series capacitance operably coupled between a driver component and the gate of the at least one IGBT device based at least partly on the determined gate voltage error;
   increasing an amount of charge stored in the at least one series capacitance, if the gate voltage of the IGBT device is greater than the gate reference voltage; and decreasing the amount of charge stored in the at least one series capacitance, if the gate voltage of the IGBT device is less than the gate reference voltage.

15. The method of claim 14, wherein the method comprises comparing a gate voltage of the IGBT device to a gate reference voltage to determine the gate voltage error.

16. The method of claim 14, wherein the method comprises controlling a current source to apply a current to the at least one series capacitance proportional to the determined gate voltage error.

17. The method of claim 14, wherein the method comprises determining a gate voltage error at the at least one gate of the at least one IGBT device and dynamically adjusting a charge of the at least one series capacitance based on the determined gate voltage error during a high gate drive phase of a pulse width modulation drive mode.

\* \* \* \* \*